(12) United States Patent
Bi et al.

(10) Patent No.: US 11,489,044 B2
(45) Date of Patent: Nov. 1, 2022

(54) NANOSHEET TRANSISTOR BOTTOM ISOLATION

(71) Applicant: INTERNATIONAL BUSINESS MACHINES CORPORATION, Armonk, NY (US)

(72) Inventors: Zhenxing Bi, Dunn Loring, VA (US); Kangguo Cheng, Schenectady, NY (US); Yi Song, Albany, NY (US); Lijuan Zou, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 17/134,667

(22) Filed: Dec. 28, 2020

(65) Prior Publication Data

US 2021/0151558 A1    May 20, 2021

Related U.S. Application Data

(62) Division of application No. 16/353,447, filed on Mar. 14, 2019, now Pat. No. 10,937,860.

(51) Int. Cl.
*H01L 29/06* (2006.01)
*H01L 23/532* (2006.01)
(Continued)

(52) U.S. Cl.
CPC .... *H01L 29/0649* (2013.01); *H01L 21/02532* (2013.01); *H01L 21/76224* (2013.01);
(Continued)

(58) Field of Classification Search
CPC ............... H01L 29/0649; H01L 29/785; H01L 21/76224; H01L 21/76837;
(Continued)

(56) References Cited

U.S. PATENT DOCUMENTS 6,582,986 B2    6/2003  Kong et al.
7,435,656 B2   10/2008  Shima
(Continued)

FOREIGN PATENT DOCUMENTS

| CN | 104051340 | 9/2014 |
|---|---|---|
| CN | 105355562 | 2/2016 |
| KR | 20000056248 | 9/2000 |

OTHER PUBLICATIONS

Saurabh Gupta et al., "Reducing Threading Dislocation Densities in SiGe Mismatched Layers by Controlling Stain Rate and Surface Roughness", 2006 International SiGe Technology and Device Meeting, Princeton, NJ, May 2006.
(Continued)

*Primary Examiner* — Christine A Enad
(74) *Attorney, Agent, or Firm* — Tutunjian & Bitetto, P.C.; Samuel Waldbaum

(57) ABSTRACT

Semiconductor devices and methods of forming the same include forming slanted dielectric structures from a first dielectric material on a substrate, with gaps between adjacent slanted dielectric structures. A first semiconductor layer is grown from the substrate, using a first semiconductor material, including a lower portion that fills the gaps and an upper portion above the first dielectric material. The lower portion of the first semiconductor layer is replaced with additional dielectric material.

16 Claims, 8 Drawing Sheets

(51) Int. Cl.
*H01L 21/8234* (2006.01)
*H01L 21/762* (2006.01)
*H01L 21/768* (2006.01)
*H01L 29/165* (2006.01)
*H01L 29/66* (2006.01)
*H01L 21/02* (2006.01)
*H01L 29/78* (2006.01)

(52) U.S. Cl.
CPC .......... *H01L 21/76837* (2013.01); *H01L 21/823412* (2013.01); *H01L 21/823431* (2013.01); *H01L 21/823481* (2013.01); *H01L 23/53295* (2013.01); *H01L 29/165* (2013.01); *H01L 29/6681* (2013.01); *H01L 29/66545* (2013.01); *H01L 29/785* (2013.01)

(58) Field of Classification Search
CPC ..... H01L 21/823412; H01L 21/823431; H01L 21/823481
See application file for complete search history.

(56) References Cited

U.S. PATENT DOCUMENTS

| | | | |
|---|---|---|---|
| 9,461,114 | B2 | 10/2016 | Obradovic et al. |
| 9,653,289 | B1* | 5/2017 | Balakrishnan ...... H01L 29/4983 |
| 9,859,381 | B2 | 1/2018 | Li et al. |
| 10,032,867 | B1* | 7/2018 | Yeung ................ H01L 29/0649 |
| 10,680,126 | B2* | 6/2020 | Li ...................... H01L 31/0693 |
| 2009/0039361 | A1* | 2/2009 | Li ..................... H01L 29/66795 |
| | | | 257/190 |
| 2017/0162453 | A1 | 6/2017 | Pillarisetty et al. |
| 2018/0145133 | A1 | 5/2018 | Loubet et al. |
| 2018/0219064 | A1 | 8/2018 | Cheng et al. |
| 2018/0261670 | A1 | 9/2018 | Yeung et al. |
| 2020/0119203 | A1* | 4/2020 | Teo .................. H01L 29/42392 |

OTHER PUBLICATIONS

List of IBM Patents or Patent Applications Treated as Related dated Dec. 28, 2020, 2 pages.

* cited by examiner

NANOSHEET TRANSISTOR BOTTOM ISOLATION

BACKGROUND

Technical Field

The present invention generally relates to semiconductor device fabrication and, more particularly, to nanosheet field effect transistors with bottom isolation.

Description of the Related Art

Field effect transistors (FETs) can be formed using a number of basic structures. In some devices, nanosheet channels are used and are formed by depositing alternating sheets of channel material and sacrificial material. However, such devices can be limited in the thickness of channel layers, as lattice strain between the channel material and the sacrificial material can cause defects to form. Furthermore, isolating the bottom of the device with a dielectric layer can be challenging, as dielectric material can pinch off in devices with high aspect ratios, preventing the dielectric material from adequately filling the needed space.

SUMMARY

A method of forming a semiconductor device includes forming slanted dielectric structures from a first dielectric material on a substrate, with gaps between adjacent slanted dielectric structures. A first semiconductor layer is grown from the substrate, using a first semiconductor material, including a lower portion that fills the gaps and an upper portion above the first dielectric material. The lower portion of the first semiconductor layer is replaced with additional dielectric material.

A method of forming a semiconductor device includes masking an original dielectric layer, formed from a first dielectric material, with a pattern that exposes strips of a top surface of the original dielectric layer. A tilted implantation is performed that converts exposed portions of the original dielectric layer to a second dielectric material. Remaining first dielectric material is etched away to form the gaps between the portions of the second dielectric material. A first semiconductor is grown layer from the substrate, using a first semiconductor material, including a lower portion that fills the gaps and an upper portion above the second dielectric material. The lower portions of the first semiconductor layer are replaced with additional dielectric material.

A semiconductor device includes a bottom dielectric isolation layer. Stacks of vertically arranged channel layers are formed over the bottom isolation layer. Gate stacks are formed on and between the vertically arranged channel layers of respective stacks from the plurality of stacks.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a slanted dielectric deposition to form a bottom layer of sacrificial semiconductor material that is free from defects. The portion of the bottom layer of sacrificial semiconductor material between the slanted dielectric structures is etched away and replaced by additional dielectric material to fully isolate the bottom of nano sheet fin stacks.

Figure 1:
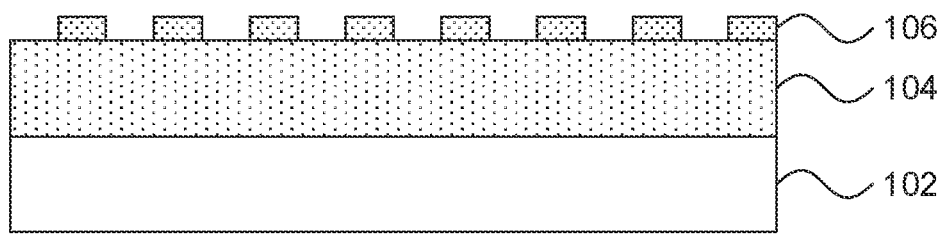
FIG. 1 is a cross-sectional diagram of a step in the formation of a semiconductor device that shows the formation of a mask pattern on a base dielectric layer in accordance with an embodiment of the present invention.

Referring now to FIG. 1, a cross-sectional view of a step in the formation of a semiconductor device is shown. A substrate 102 is shown with a dielectric layer 104 formed on top of it. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The dielectric layer 104 can similarly be formed from any appropriate dielectric material, but it is specifically contemplated that silicon nitride may be used. The dielectric layer can be formed by any appropriate deposition process, including, e.g., chemical vapor deposition (CVD), physical vapor deposition (PVD), atomic layer deposition (ALD), or gas cluster ion beam (GCIB) deposition to an exemplary thickness between about 10 nm and about 50 nm. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

A mask 106 is formed on the dielectric layer 104. The mask 106 can be formed from any appropriate material that has good etch selectivity with respect to the material of the dielectric layer 104, and it is specifically contemplated that a photoresist material can be deposited and then patterned to form strips (shown in cross-section). The pattern of the mask 106 exposes portions of the top surface of the dielectric layer 104. It is specifically contemplated that the mask can have a thickness between about 5 nm and about 20 nm.

Figure 2:
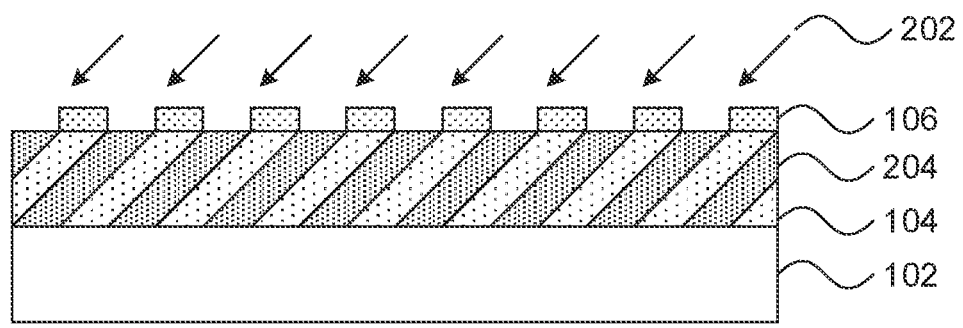
FIG. 2 is a cross-sectional diagram of a step in the formation of a semiconductor device that shows a tilted implantation that converts exposed portions of the base dielectric layer to a second dielectric material in accordance with an embodiment of the present invention.

Referring now to FIG. 2, a cross-sectional view of a step in the formation of a semiconductor device is shown. A tilted implantation process is performed using, for example, carbon to convert exposed portions of the dielectric layer 106 from the original dielectric material to a new dielectric material. Thus, in the exemplary embodiment that uses silicon nitride as the dielectric material for dielectric layer 106, diagonal strips 204 of silicon carbonitride can be formed. It is specifically contemplated that the tilted implantation process can be performed at an angle of about forty-five degrees, though it should be understood that any angle can be used instead, as long as the resulting strips 204 at least partially overlay one another. It should be noted that, although some carbon doping may occur in the substrate 102, this does not affect the functionality of the final device, as the device will be isolated from the substrate 102.

Figure 3:
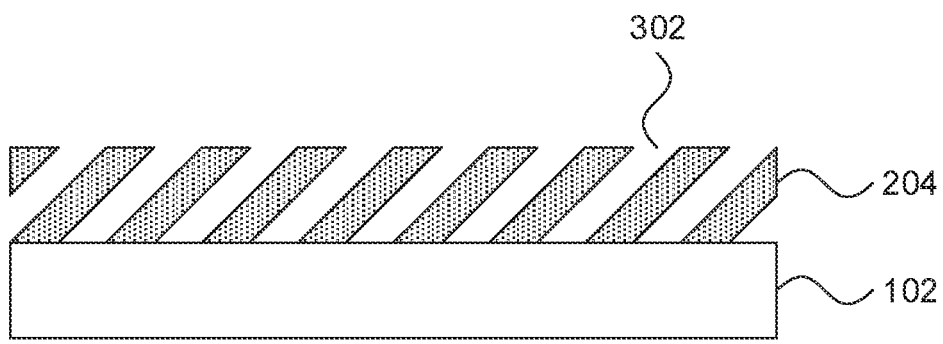
FIG. 3 is a cross-sectional diagram of a step in the formation of a semiconductor device that shows the unconverted material of the base dielectric layer being etched away, leaving the second dielectric material in accordance with an embodiment of the present invention.

Referring now to FIG. 3, a cross-sectional view of a step in the formation of a semiconductor device is shown. The mask 106 and the remaining original dielectric material 104 are etched away. It is specifically contemplated that an isotropic etch, such as a wet or dry chemical etch, can be used to selectively remove the original dielectric material 104 without damaging the implanted dielectric material 204. In one particularly contemplated embodiment, a molecular gas phase isotropic etch can be used. As used herein, the term "selective" in reference to a material removal process denotes that the rate of material removal for a first material is greater than the rate of removal for at least another material of the structure to which the material removal process is being applied.

Figure 4:
FIG. 4 is a cross-sectional diagram of a step in the formation of a semiconductor device that shows the epitaxial growth of a semiconductor material from a semiconductor substrate, where threading dislocations are blocked by the second dielectric material in accordance with an embodiment of the present invention.

Referring now to FIG. 4, a cross-sectional view of a step in the formation of a semiconductor device is shown. A sacrificial semiconductor layer 404 is epitaxially grown from the exposed surface of the underlying substrate 102. In one particular embodiment, where the substrate 102 includes a silicon top surface, the sacrificial semiconductor layer 404 can be formed from silicon germanium with a germanium concentration of about 25% or higher. As used herein, the term "epitaxial growth" refers to the growth of a semiconductor material on a deposition surface of a semiconductor material, in which the semiconductor material being grown has the same crystalline characteristics as the semiconductor material of the deposition surface.

In the present example, because silicon germanium and silicon have similar crystalline structures, one material can be epitaxially grown on the other. However, the presence of germanium results in some degree of lattice mismatch and, in regions where the strain is high, can cause threading dislocations 404. Threading dislocations occur when the angle between the Burgers vector and the dislocation is ninety degrees. Threading dislocations are not localized and can propagate from the surface of the strained layer. Threading dislocations rise from the surface of the substrate 102 at a ninety degree angle from the surface, in the <100> direction, but are blocked by the slanted dielectric structures 204. In this way, threading dislocations are prevented from extending to the portion of the sacrificial semiconductor layer 402 that rises above the slanted dielectric structures 204.

Figure 5:
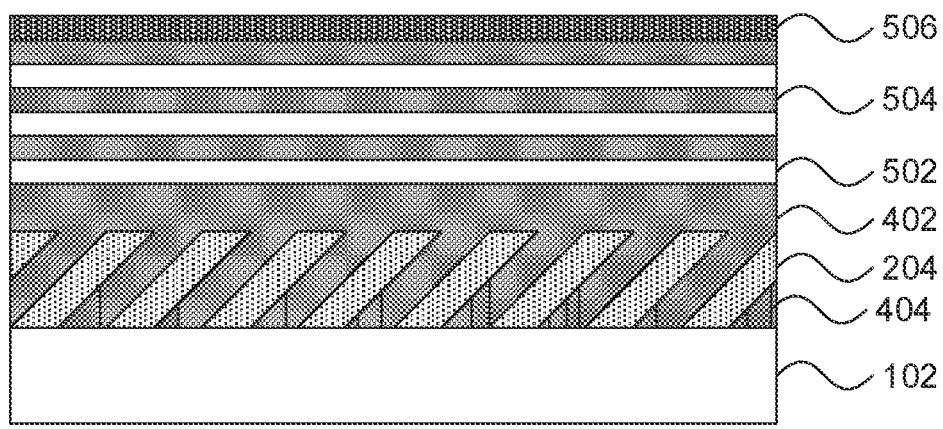
FIG. 5 is a cross-sectional diagram of a step in the formation of a semiconductor device that shows the formation of a stack of alternating semiconductor layers in accordance with an embodiment of the present invention.

Referring now to FIG. 5, a cross-sectional view of a step in the formation of a semiconductor device is shown. A stack of alternating channel layers 502 and sacrificial semiconductor layers 504 are grown on top of the original sacrificial semiconductor layer 402. It is specifically contemplated that the channel layers 502 can be formed from a semiconductor material such as, e.g., silicon, though it should be understood that any appropriate semiconductor material that can be epitaxially grown from the original sacrificial semiconductor layer 402 can be used. The stack sacrificial semiconductor layers 504 are epitaxially grown from the channel layers 502, and any appropriate number of alternating layers can be used. The stack sacrificial semiconductor layers 504 can be formed from the same material as the original sacrificial semiconductor layer 402, for example silicon germanium with a germanium concentration of about 25%, or can be formed from any other appropriate semiconductor material. In some embodiments a top dielectric layer 506 is formed over the last alternating layer and can be formed from, e.g., silicon dioxide.

Figure 6:
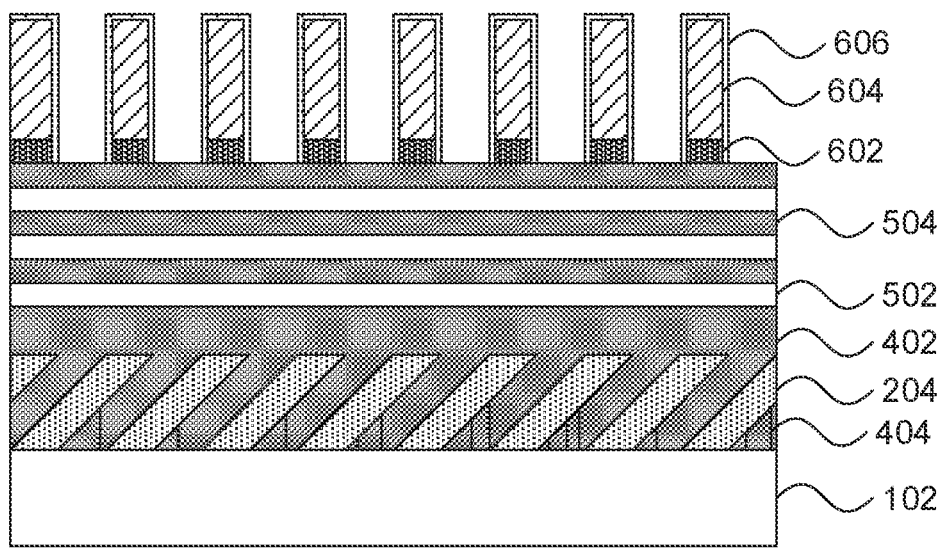
FIG. 6 is a cross-sectional diagram of a step in the formation of a semiconductor device that shows the formation of dummy gate structures on the stack of alternating semiconductor layers in accordance with an embodiment of the present invention.

Referring now to FIG. 6, a cross-sectional view of a step in the formation of a semiconductor device is shown. A layer of dummy gate material, such as polycrystalline silicon, is formed over the top dielectric layer 506 and is anisotropically etched, along with the top dielectric layer 506, to form dummy gate dielectric 602 and dummy gates 604. A dielectric layer 606 is formed over the dummy gate structure from, e.g., silicon nitride. The anisotropic etch can include reactive ion etching (RIE), which is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the dummy gates 604 can be formed by spacer imaging transfer.

Figure 7:
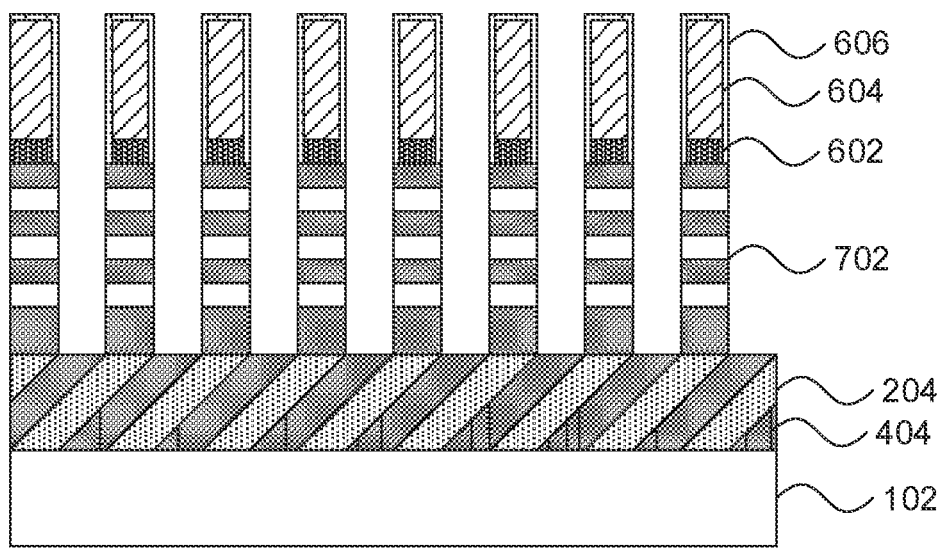
FIG. 7 is a cross-sectional diagram of a step in the formation of a semiconductor device that shows the formation of fins from the stack of alternating semiconductor layers in accordance with an embodiment of the present invention.

Referring now to FIG. 7, a cross-sectional view of a step in the formation of a semiconductor device is shown. The dummy gates 604 are used as a match for an etch process that anisotropically etches down into the stack of alternating channel layers 502 and sacrificial semiconductor layers 504 and the original sacrificial semiconductor layer 402 to form fin stacks 702. In some embodiments, the etch that is used to form the fin stacks 702 can be combined with end point detection, whereby material from the slanted dielectric layers 204 is detected, triggering a halt to the etch. The etch can be performed in one or more etches, for example with an RIE or other anisotropic etch that is selective to the alternating layers and does not harm the material of the dummy gates 604. In some embodiments, alternating selective etches can be used to etch back respective alternating layers in the stack.

Figure 8:
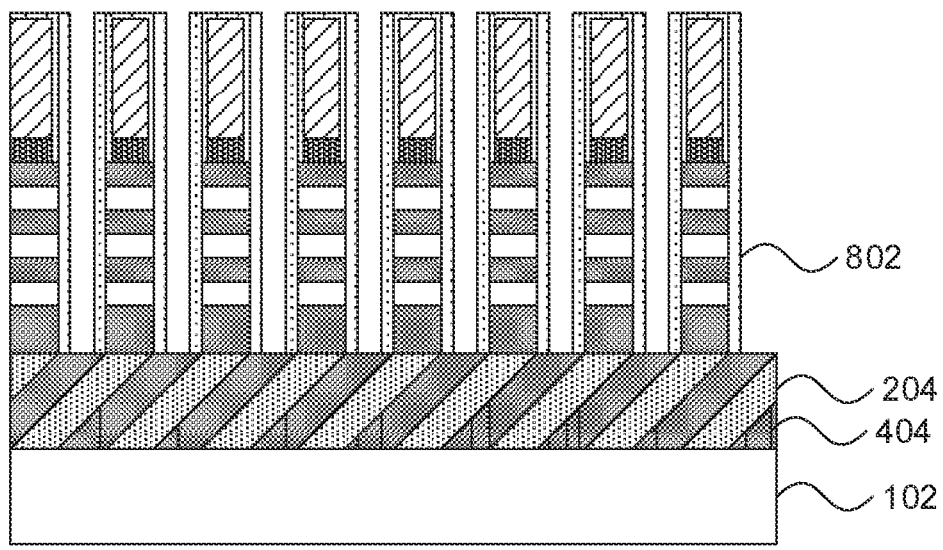
FIG. 8 is a cross-sectional diagram of a step in the formation of a semiconductor device that shows the formation of sidewall spacers on the fins in accordance with an embodiment of the present invention.

Referring now to FIG. 8, a cross-sectional view of a step in the formation of a semiconductor device is shown. Sidewall spacers 802 are formed on sidewalls of the fin stacks. The sidewall spacers can be formed from any appropriate dielectric material, such as silicon nitride, and can be deposited using a conformal deposition process, such as ALD or CVD, followed by a selective anisotropic etch that removes the dielectric material from horizontal surfaces. The sidewall spacers 802 thereby leave the top surfaces of the dummy gates 604 and the top surface of the original sacrificial semiconductor layer 402 exposed.

Figure 9:
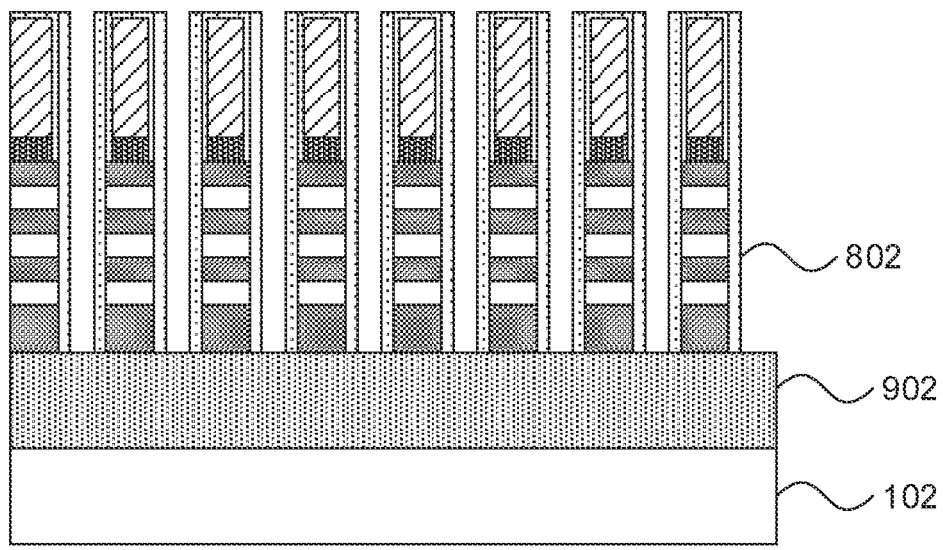
FIG. 9 is a cross-sectional diagram of a step in the formation of a semiconductor device that shows the replacement of the semiconductor material between the slanted dielectric structures with additional dielectric materials to complete an isolation layer in accordance with an embodiment of the present invention.

Referring now to FIG. 9, a cross-sectional view of a step in the formation of a semiconductor device is shown. The remaining sacrificial semiconductor material from the sacrificial semiconductor layer is etched away with an isotropic etch that selectively removes the sacrificial semiconductor material without substantially harming the underlying substrate 102, the diagonal dielectric strips 204, and the sidewall spacers 802. Additional dielectric material is deposited to fill in the gaps between the diagonal dielectric strips 204, forming a single bottom dielectric layer 902. It is specifically contemplated that the additional dielectric material can match the material of the diagonal dielectric strips 204 (e.g., SiCN), but it should be understood that other dielectric materials, such as silicon nitride, can be used instead.

The single bottom dielectric layer 902 thereby forms a complete electrical barrier underneath the fins that prevents electrical conduction between neighboring fins and between the fins and the underlying substrate 102. The present embodiments thereby provide full bottom isolation.

Figure 10:
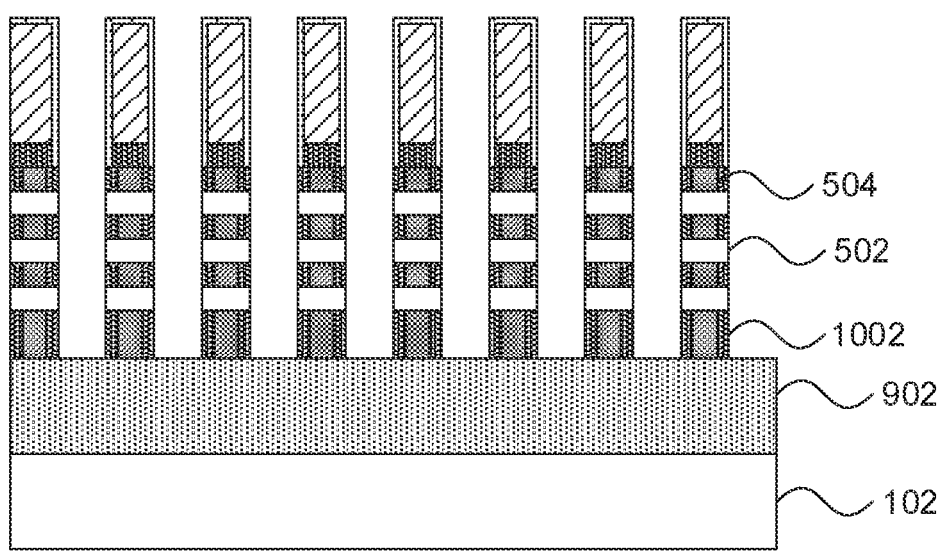
FIG. 10 is a cross-sectional diagram of a step in the formation of a semiconductor device that shows the formation of inner spacers between channel layers in accordance with an embodiment of the present invention.

Referring now to FIG. 10, a cross-sectional view of a step in the formation of a semiconductor device is shown. The sidewall spacers 802 are etched away with, e.g., an isotropic etch that selectively removes the material of the sidewall spacers without harming the alternating layers or the bottom dielectric layer 902. A thermal oxidation process can then be used to form inner spacers 1002 at sidewalls of the sacrificial semiconductor layers 504. The thermal oxidation process preferentially oxidizes the sacrificial material. In embodiments where silicon germanium is used as the sacrificial material, the thermal oxidation forms silicon dioxide inner spacers 1002, which causes germanium to be pushed inward. In embodiments that use thermal oxidation, a small amount of oxide is formed on silicon surfaces, but is then removed with a quick etch.

In other embodiments, the inner spacers can be formed by recessing the sacrificial semiconductor layers 504, followed by a conformal deposition of dielectric material, followed by a selective anisotropic etch that removes any such dielectric material that is not protected within the recesses. It is specifically contemplated that the inner spacers can be formed from silicon dioxide, though it should be understood that other dielectric materials with appropriate etch selectivities can be used instead.

Figure 11:
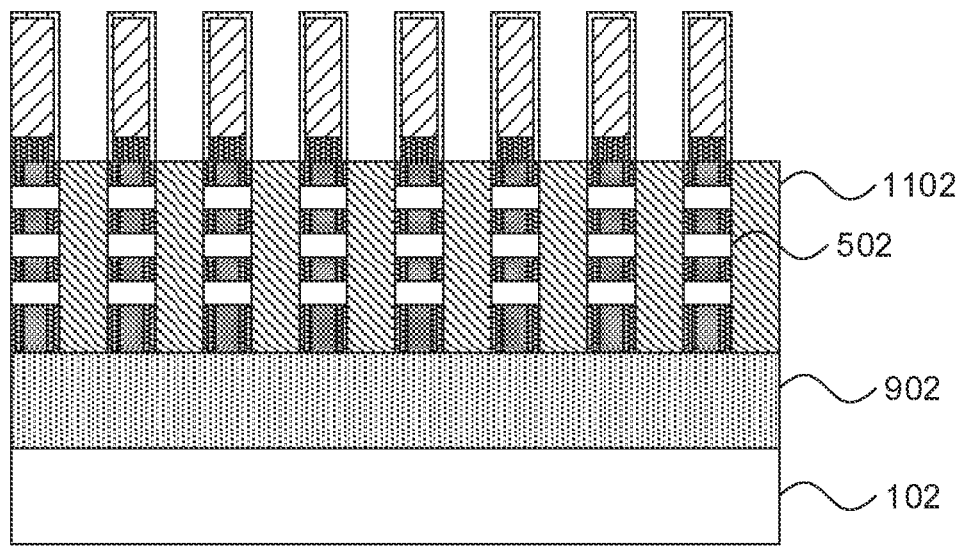
FIG. 11 is a cross-sectional diagram of a step in the formation of a semiconductor device that shows the formation of source/drain structures from exposed sidewalls of the channel layers in accordance with an embodiment of the present invention.

Referring now to FIG. 11, a cross-sectional view of a step in the formation of a semiconductor device is shown. Source and drain regions 1102 are epitaxially grown from the exposed sidewalls of the channel layers 502. The grown source/drain material fills the space between the fins 702. It is specifically contemplated that the source/drain regions 1102 can be doped in situ using any appropriate n-type or p-type dopant, but it should be understood that other forms of doping, such as ion implantation or diffusion annealing, can be used instead.

Figure 12:
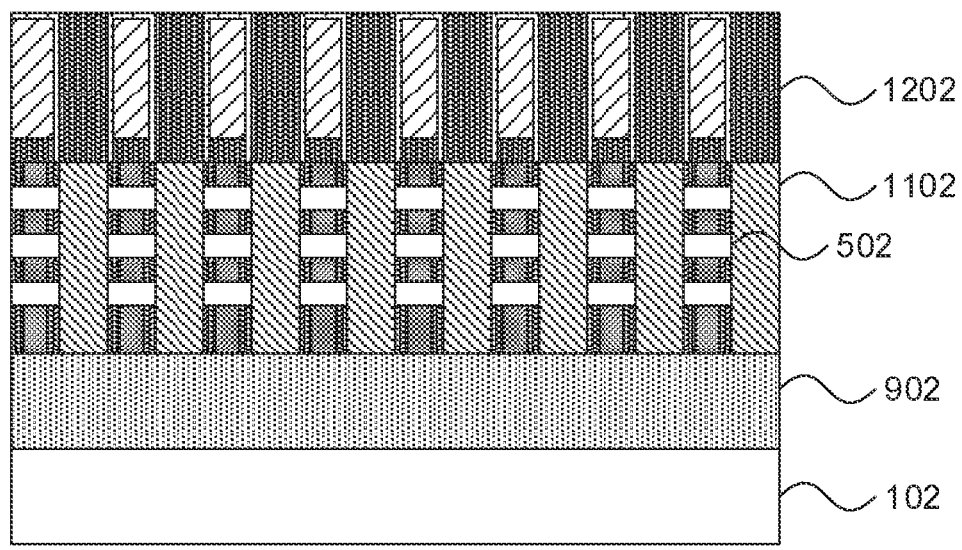
FIG. 12 is a cross-sectional diagram of a step in the formation of a semiconductor device that shows the formation of an interlayer dielectric in accordance with an embodiment of the present invention.

Referring now to FIG. 12, a cross-sectional view of a step in the formation of a semiconductor device is shown. A passivating dielectric layer 1202 is formed by depositing dielectric material to a height above that of the dummy gates 604. The dielectric material is then polished down to the height of the dummy gates 604 using a chemical mechanical planarization (CMP) process. It is specifically contemplated that the passivating dielectric layer 1202 can be formed using silicon dioxide, but it should be understood that any other appropriate dielectric material can be used instead.

Figure 13:
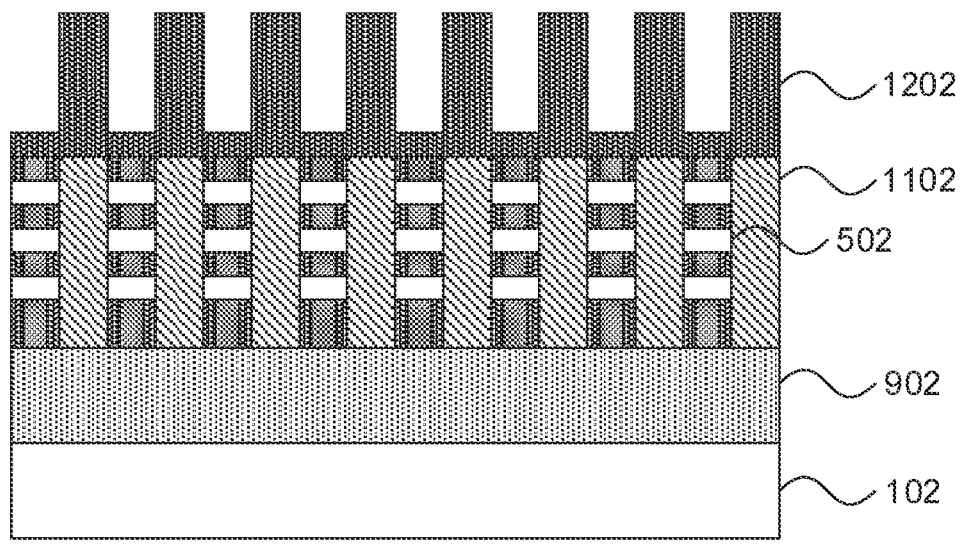
FIG. 13 is a cross-sectional diagram of a step in the formation of a semiconductor device that shows etching away the dummy gate structures in accordance with an embodiment of the present invention.

Referring now to FIG. 13, a cross-sectional view of a step in the formation of a semiconductor device is shown. The dummy gates 604 are etched away using any appropriate selective isotropic or anisotropic etch process.

Figure 14:
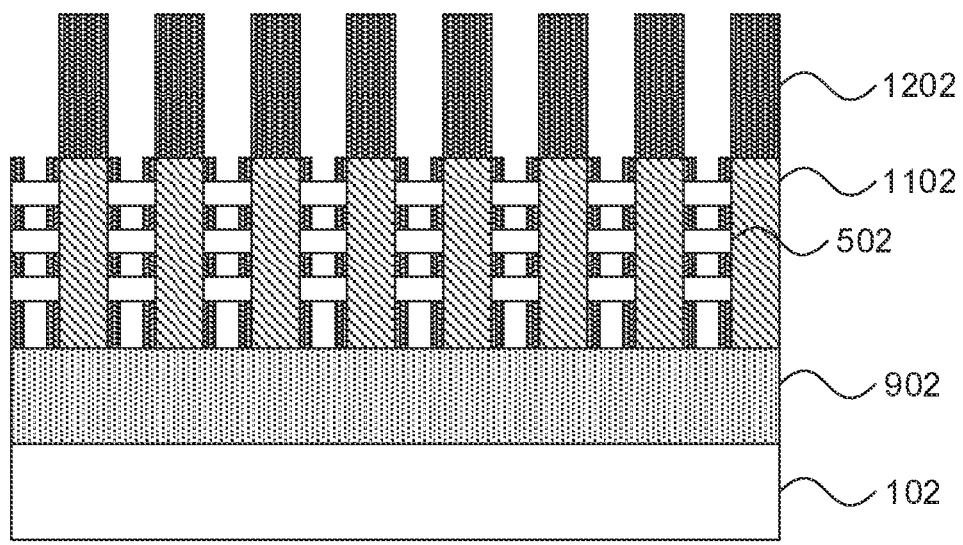
FIG. 14 is a cross-sectional diagram of a step in the formation of a semiconductor device that shows etching away sacrificial material from the fins, exposing the channel layers, in accordance with an embodiment of the present invention.

Referring now to FIG. 14, a cross-sectional view of a step in the formation of a semiconductor device is shown. The dummy gate dielectric 602 is etched away and the sacrificial layers 504 are etched away, exposing the channel layers 502. The selective removal of the sacrificial semiconductor layers 504 is performed without substantially harming the channel layers 502.

Figure 15:
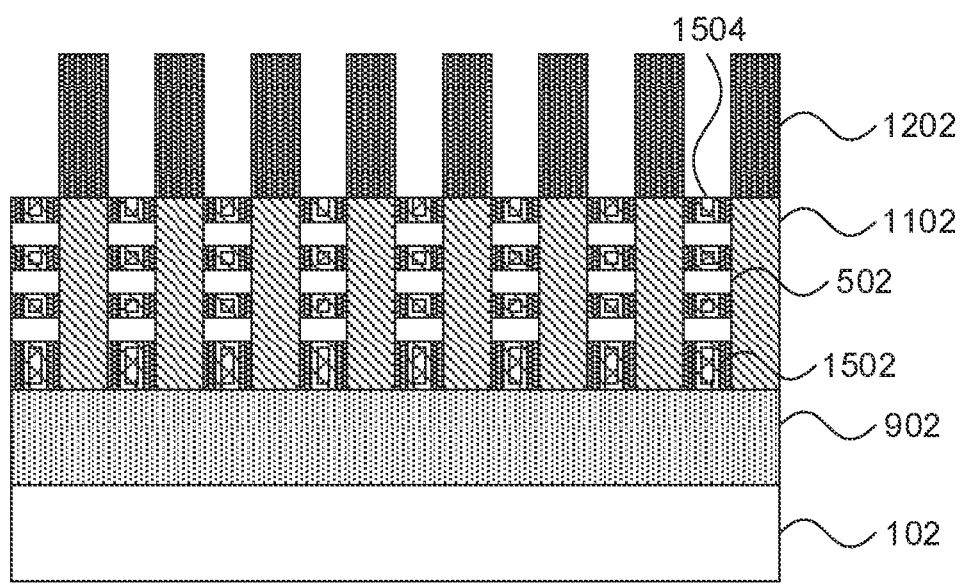
FIG. 15 is a cross-sectional diagram of a step in the formation of a semiconductor device that shows the formation of a gate stack on the channel layers in accordance with an embodiment of the present invention.

Referring now to FIG. 15, a cross-sectional view of a step in the formation of a semiconductor device is shown. A gate stack is formed over and around the exposed portions of the channel layers 502. A gate dielectric 1502 is first formed by any appropriate conformal deposition process. A gate conductor 1504 is then deposited to fill the remaining spaces. Excess gate conductor and gate dielectric material can then be anisotropically etched back to any appropriate height.

It is specifically contemplated that the gate dielectric layer 1502 can be formed from a high-k dielectric material, but it should be understood that any appropriate non-conductive material can be used instead. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

It is specifically contemplated that the gate conductor 1504 can be formed from a conductive metal, but it should be understood that any appropriate conductive material can be used instead. Examples of materials for the gate conductor 1504 include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

At this stage, contacts can be formed to the gate conductor 1504 and to the source/drain regions 1102 by forming vias as appropriate and filling the vias with conductive material. Additional processing steps can be performed as well, for example recessing the gate stacks and filling in with an interlayer dielectric material before forming the contacts.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 16:
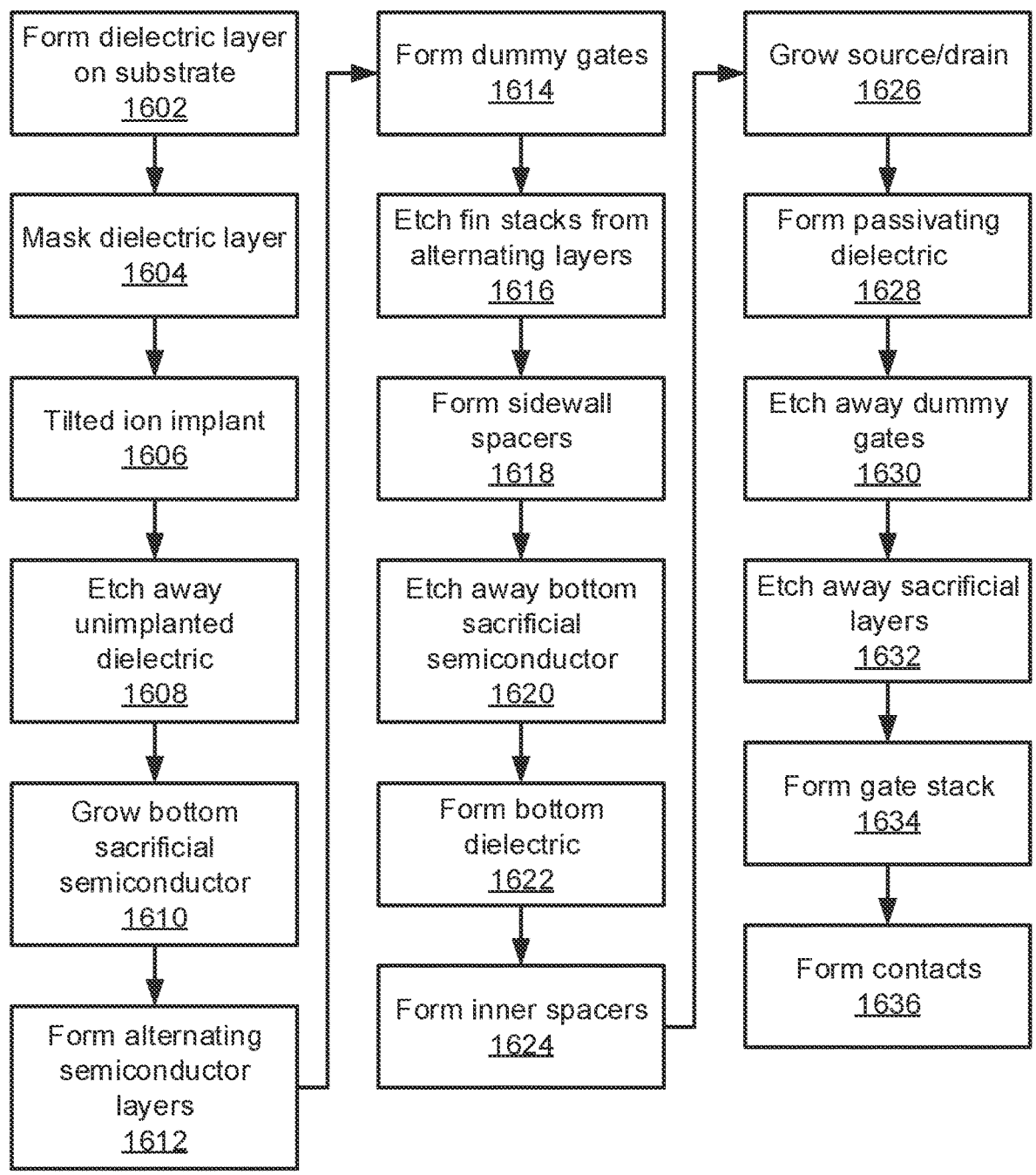
FIG. 16 is a block/flow diagram of a process for forming a semiconductor device in accordance with an embodiment of the present invention.

Referring now to FIG. 16, a method for forming a semiconductor device is shown. Block 1602 forms dielectric layer 104 on the substrate 102. It is specifically contemplated that the base dielectric layer 104 can be formed from silicon nitride, but it should be understood that any appropriate dielectric material can be used instead. Block 1604 then forms mask 106 on the dielectric layer 104, forming strips of masking material with gaps between them exposing the surface of the dielectric layer 104.

Block 1606 performs a tilted ion implant to convert the affected portions of the dielectric layer 104 to diagonal strips 204. It is specifically contemplated that carbon implantation can be performed to convert silicon nitride in the dielectric layer 104 to silicon carbonitride. It should be understood that the angle of implantation can be selected to ensure that the converted diagonal strips 204 overlap vertically, with a top portion of each diagonal strip 204 being positioned over a bottom portion of an adjacent diagonal strip 204. Block 1608 then etches away the unconverted portions of dielectric layer 104, leaving the diagonal strips 204 standing free on the substrate 102.

Block 1610 epitaxially grows a first layer of sacrificial layer material 402 from the substrate 102. The presence of the diagonal strips 204 prevents the propagation of threading dislocations 404, providing a layer above the diagonal strips 204 with a good crystal structure. It is specifically contemplated that the first sacrificial layer 402 can be formed from silicon germanium with a germanium concentration selected to provide selectivity between the first sacrificial layer 402 and the channel layers, described below.

Block 1612 forms alternating semiconductor layers, including channel layers 502 and sacrificial layers 504 in a stack. It is specifically contemplated that the layers can be epitaxially grown on one another. Silicon can be used as a material for the channel layers 502, as it is compatible with the crystalline structure of silicon germanium and is selectively etchable therewith. Any number of alternating layers can be formed in this manner. Block 1614 then forms dummy gates 604 over the stack of layers by depositing a layer of dummy gate material, such as polycrystalline silicon, and anisotropically etching the dummy gate material into fins.

Block 1616 etches down into the stack of alternating layers to form fins 702. The etch penetrates down to the diagonal dielectric strips 204. Block 1618 forms sidewall spacers 802 on the sidewalls of the fins 702 by conformally depositing a dielectric material and then anisotropically etching to remove the dielectric material from horizontal surfaces. The dielectric material of the sidewall spacers 802 is selected to have etch selectivity with respect to the dielectric material of the diagonal dielectric strips 204.

Block 1620 etches away any exposed sacrificial semiconductor material from the first layer of sacrificial material 402 using an isotropic etch, in particular removing material from between the diagonal dielectric strips 204. Block 1622 then fills in the gaps between the diagonal dielectric strips 204 with an appropriate dielectric material, forming a complete dielectric layer underneath the fins 702.

Block 1624 etches away the sidewall spacers 802 and forms inner spacers 1002 by, e.g., a germanium condensation process or by recessing the sacrificial layers 504, conformally depositing a dielectric layer, and etching away any of the deposited material that is not protected by a recess. Block 1626 epitaxially grows source and drain regions 1102 from the exposed sidewalls of the channel layers 502.

Block 1628 forms a passivating dielectric by, e.g., depositing dielectric material to a height above a height of the dummy gates 604 and then polishing down to the height of the dummy gates 604 using a CMP process. Block 1630 etches away the dummy gates and block 1632 etches away the remaining sacrificial layers 504 and 402, exposing the channel layers 502. Block 1634 forms a gate stack by depositing gate dielectric layer 1502 and gate conductor 1504. Block 1636 then finishes the device by forming conductive contacts to the gate conductor 1504 and to the source/drain regions 1102. Additional processing steps can include the deposition of recessing the gate stack and the deposition of an interlayer dielectric.

Having described preferred embodiments of nano sheet transistor bottom isolation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a bottom dielectric isolation layer comprising a plurality of slanted dielectrics having a first dielectric material that are separated by directly abutting dielectric fill regions of a second dielectric material, the first dielectric material being a different composition than the second dielectric material;
a plurality of stacks of vertically arranged channel layers formed over the bottom isolation layer; and a plurality of gate stacks formed on and between the vertically arranged channel layers of respective stacks from the plurality of stacks.

2. The semiconductor device of claim 1, wherein the first dielectric material is silicon carbonitride and the second dielectric material is silicon nitride.

3. The semiconductor device of claim 1, wherein at least a portion of a top surface of at least one of the plurality of slanted dielectric structures formed from the first dielectric material vertically overlaps with at least a portion of a bottom surface of a respective adjacent slanted dielectric structure formed from the first dielectric material.

4. The semiconductor device of claim 1, wherein the vertically arranged channel layers lack threading dislocations.

5. The semiconductor device of claim 1, wherein the vertically arranged channel layers include stacked semiconductor material layers separated by regions of isolation.

6. The semiconductor device of claim 5, wherein source and drain regions are present on opposing sides of the stacked semiconductor material layers.

7. The semiconductor device of claim 6, wherein the source and drain regions provide are in epitaxial relationship with a plurality of the stacked semiconductor material layers to provide merged source and drain regions.

8. The semiconductor device of claim 1, wherein the plurality of gate stacks include a gate dielectric that wraps around the vertically arranged channel layers.

9. A semiconductor device, comprising:
an isolation layer comprising slanted dielectric structures, wherein slanted dielectric structures are comprised of a first dielectric material and gaps between the slanted dielectric structures are filled with a second dielectric material, and at least a portion of a top surface of at least one of the plurality of slanted dielectric structures formed from the first dielectric material vertically overlaps with at least a portion of a bottom surface of a respective adjacent slanted dielectric structure formed from the first dielectric material;
a plurality of stacked channel layers present on the dielectric layer; and
a plurality of gate stacks present on the stacked channel layers.

10. The semiconductor device of claim 9, wherein the first dielectric material is silicon carbonitride and the second dielectric material is silicon nitride.

11. The semiconductor device of claim 9, wherein the stacked channel layers lack threading dislocations.

12. A semiconductor device, comprising:
an isolation layer comprising slanted dielectric structures, wherein slanted dielectric structures are comprised of a first dielectric material and gaps between the slanted dielectric structures are filled with a second dielectric material;
a plurality of stacked channel layers present on the dielectric layer; and
a plurality of gate stacks present on the stacked channel layers.

13. The semiconductor device of claim 12, wherein the first dielectric material is carbon and nitrogen containing dielectric and the second dielectric material is nitride containing dielectric that is substantially free of carbon.

14. The semiconductor device of claim 12, wherein the stacked channel layers lack threading dislocations.

15. The semiconductor device of claim 12, wherein source and drain regions are present on opposing sides of the plurality of stacked channel layers.

16. The semiconductor device of claim 12, wherein the plurality of gate stacks include a gate dielectric that wraps around the plurality of stacked channel layers.

* * * * *